(12) United States Patent
Liu et al.

(10) Patent No.: US 8,835,240 B2
(45) Date of Patent: Sep. 16, 2014

(54) METHOD FOR FABRICATING SEMICONDUCTOR DEVICE

(75) Inventors: An-Chi Liu, Tainan (TW); Chih-Wen Teng, Chiayi County (TW); Tzu-Yu Tseng, Tainan (TW); Chi-Heng Lin, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 45 days.

(21) Appl. No.: 13/411,703

(22) Filed: Mar. 5, 2012

(65) Prior Publication Data

US 2013/0230989 A1    Sep. 5, 2013

(51) Int. Cl.
*H01L 21/8238* (2006.01)

(52) U.S. Cl.
USPC ..... 438/199; 438/791; 257/369; 257/E21.632

(58) Field of Classification Search
None
See application file for complete search history.

(56) References Cited

U.S. PATENT DOCUMENTS

| 7,994,059 | B2 | 8/2011 | Richter et al. |
| 8,362,571 | B1 * | 1/2013 | Wu et al. ............. 257/384 |
| 2005/0263825 | A1 * | 12/2005 | Frohberg et al. ............. 257/369 |
| 2009/0020791 | A1 * | 1/2009 | Yu et al. ............. 257/288 |
| 2009/0294927 | A1 | 12/2009 | Lu et al. |
| 2010/0001317 | A1 * | 1/2010 | Chen et al. ............. 257/192 |
| 2012/0299160 | A1 * | 11/2012 | Baars et al. ............. 257/629 |

* cited by examiner

*Primary Examiner* — Zandra Smith
*Assistant Examiner* — Pamela E Perkins
(74) *Attorney, Agent, or Firm* — WPAT, PC; Justin King

(57) ABSTRACT

A method for fabricating a semiconductor device is provided, wherein the method comprises steps as follows: A first conductive-type metal-oxide-semiconductor transistor and a second conductive-type metal-oxide-semiconductor transistor are firstly formed on a substrate. Subsequently, a first stress-inducing dielectric layer and a first capping layer are formed in sequence on the first conductive-type metal-oxide-semiconductor transistor; and then a second stress-inducing dielectric layer and a second capping layer are formed in sequence on the second conductive-type metal-oxide-semiconductor transistor. Next, the fist capping layer is removed.

14 Claims, 7 Drawing Sheets

METHOD FOR FABRICATING SEMICONDUCTOR DEVICE

FIELD OF THE INVENTION

The present invention relates to a method for fabricating a semiconductor device, and more particularly to a method for fabricating a semiconductor device with a stress-inducing dielectric layer.

BACKGROUND OF THE INVENTION

A metal-oxide-semiconductor field effect transistor (MOSFET) is currently one of the most promising elements applied by a semiconductor device, due to the superior characteristics in view of operating speed and/or power consumption and cost efficiency.

Currently, in order to further enhance the performance of the MOSFET, a strained-Si channel technology, such as utilizing a contact etch stop layer (CESL) with compress/strain stress (referred as stress-inducing CESL), is applied to raise the channel carrier mobility of MOSFETs.

To take a stress-inducing CESL as an example, its formation may comprises following steps: A silicon nitride (SiN) dielectric layer covering on a transistor are firstly provided, and an ultra-violate (UV) curing step is then performed to make the SiN dielectric layer gradually gaining a stress, such that the carrier mobility of the transistor subject to the stress can be improved.

However, the semiconductor device still suffers some problems as each technology nodes shrink and the dimension and element pitch of the semiconductor device are reduced. For example, during the UV curing step, voids or gaps may occur in these aforementioned material layers due to the stress gain and the difference of expansion rate between the different material layers. As a result, some undesired metal leads may occur on the metal lines or plugs generated by a subsequent interconnection process and extend along those voids. At the worst, the semiconductor device may be shortened out by those metal leads.

Therefore, there is a need of providing an advanced method for fabricating a semiconductor device to obviate the drawbacks and problems encountered from the prior art.

SUMMARY OF THE INVENTION

Therefore, one aspect of the present invention is to provide a method for fabricating a semiconductor device, wherein the method comprises steps as follows: Firstly, a first conductive-type MOS transistor and a second conductive-type MOS transistor are provided on a substrate. Subsequently, a first stress-inducing dielectric layer and a first capping layer are formed on the first conductive-type MOS transistor in sequence. A second stress-inducing dielectric layer and a second capping layer are then formed on the second conductive-type MOS transistor in sequence. Next, the first capping layer is removed.

In one embodiment of the present invention, the first conductive-type MOS transistor is an N-type MOS (referred as NMOS) transistor and the first stress-inducing dielectric layer is a tensile stress-inducing dielectric layer; the second conductive-type MOS transistor is a P-type MOS (referred as PMOS) transistor and the second stress-inducing dielectric layer is a compressive stress-inducing dielectric layer.

In one embodiment of the present invention, the formation of the tensile stress-inducing dielectric layer comprises performing an UV curing step. In one embodiment of the present invention, the formation of the tensile stress-inducing dielectric layer comprises performing a plurality of dielectric deposition steps each of which is followed by an UV curing step.

In one embodiment of the present invention, the formation of the compressive stress-inducing dielectric layer and the second capping layer comprises removing portions of the tensile stress-inducing dielectric layer and the first capping layer which are disposed on the PMOS transistor; subsequently forming the compressive stress-inducing dielectric layer and the second capping layer on the PMOS transistor and the remaining first capping layer; and removing portions of the compressive stress-inducing dielectric layer and the second capping layer which are disposed on the NMOS transistor.

In one embodiment of the present invention, the method for fabricating the semiconductor device further comprises performing a thermal annealing after the portion of first capping layer disposed on the PMOS transistor is removed.

In one embodiment of the present invention, the first conductive-type MOS transistor is a PMOS transistor and the first stress-inducing dielectric layer is a compressive stress-inducing dielectric layer; the second conductive-type MOS transistor is an NMOS transistor and the second stress-inducing dielectric layer is a tensile stress-inducing dielectric layer.

In one embodiment of the present invention, the second capping layer can be removed simultaneously while the first capping layer is removed.

In one embodiment of the present invention, the first capping layer and the second capping layer both consist of $SiO_2$, and the first stress-inducing dielectric layer and the second stress-inducing dielectric layer both consist of SiN.

In one embodiment of the present invention, the method for fabricating the semiconductor device further comprises forming a buffer layer blanketed over the substrate, the first conductive-type MOS transistor and the second conductive-type MOS transistor prior the formation of the first stress-inducing dielectric layer and the first capping layer. In one embodiment of the present invention, the buffer layer consists of $SiO_2$.

In one embodiment of the present invention, the method for fabricating the semiconductor device further comprises forming a dielectric layer on the first stress-inducing dielectric layer and the second stress-inducing dielectric layer after the first capping layer is removed. In one embodiment of the present invention, the dielectric layer consists of material used to form an inter layer dielectric (ILD) of a metal interconnection structure.

In one embodiment of the present invention, the first stress-inducing dielectric layer and the first capping layer may be formed either in the same or in different apparatus. In one embodiment of the present invention, the second stress-inducing dielectric layer and the second capping layer may be formed either in the same or in different apparatus.

In accordance with aforementioned embodiments, a method for fabricating a semiconductor device is provided in order to form a dual stress liner (DSL) on a complementary metal-oxide-semiconductor (CMOS) transistor element of the semiconductor device, wherein the method comprises several steps as follows: A first tress-inducing dielectric layer and a first capping layer are formed in sequence on an first conductive-type MOS transistor; a second stress-inducing dielectric layer and a second capping layer are then formed in sequence on a second conductive-type MOS transistor; and the first capping layer is subsequently removed.

Since voids and gaps may occur in these aforementioned material layers due to the UV curing steps of the process for forming the tensile stress-inducing dielectric layer, thus by removing the capping layers prior to the subsequent process, such as the process for forming an interconnection, the drawbacks and problems resulted from the voids and gaps can be obviated. Consequently, the problems caused by the metal leads extending along the voids and gaps and generated by the interconnection fabrication process, which may cause the semiconductor device shortened can be avoided; and the yield of the semiconductor device can be thereby increased.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
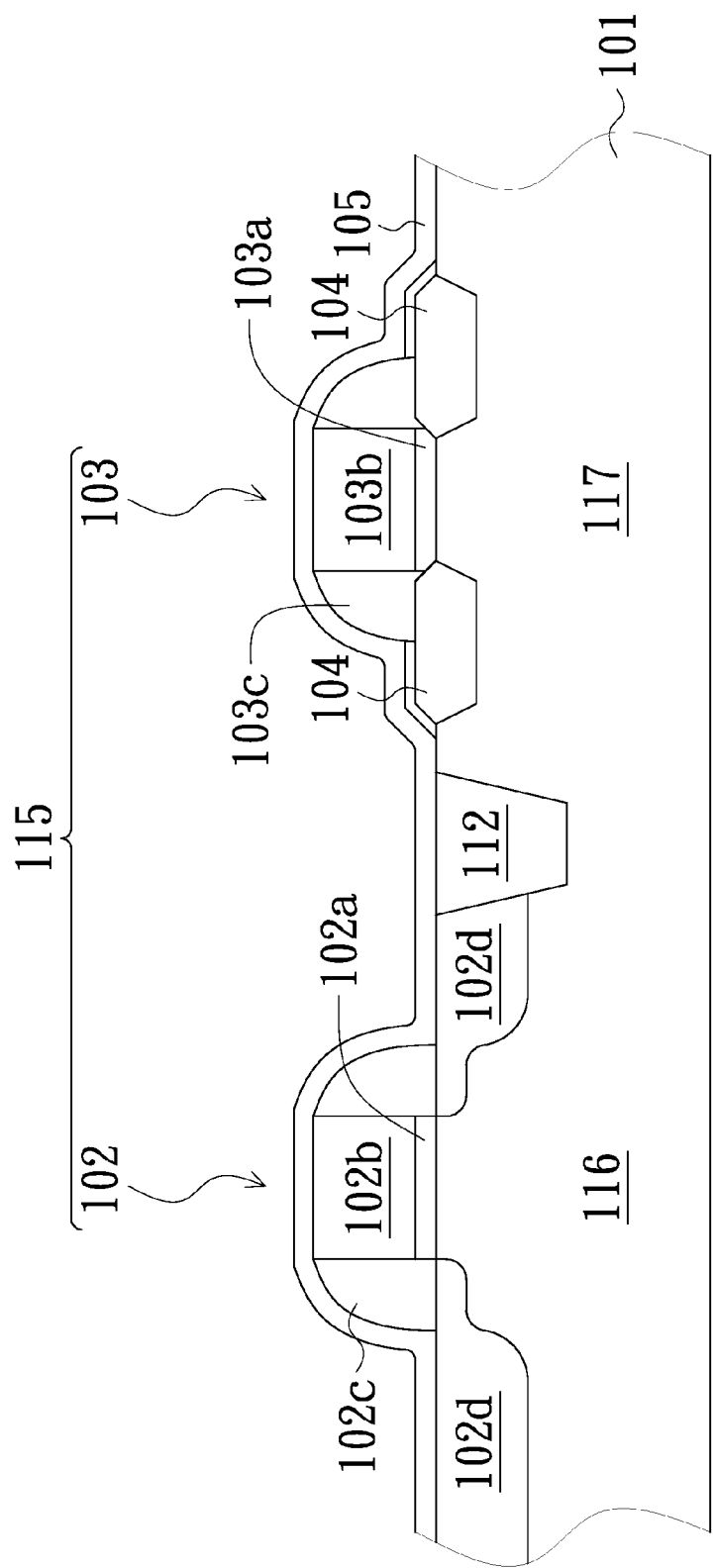
FIGS. 1A through 1G illustrate cross-sectional views of a method for fabricating a semiconductor device in accordance with one embodiment of the present invention.

A method for fabricating a semiconductor device is provided to form a DSL on a CMOS transistor element of the semiconductor device in order to improve the performance and the yield of the semiconductor device. The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A through 1G illustrate cross-sectional views of a method for fabricating a semiconductor device 100 in accordance with one embodiment of the present invention, wherein the semiconductor device 100 has at least one CMOS transistor element 115 and a DSL 118 form on the CMOS transistor element 115.

The method for fabricating the semiconductor device 100 comprises steps as follows: A CMOS transistor element 115 is firstly provided in a substrate 101, wherein the CMOS transistor element 115 comprises an NMOS transistor 102 and a PMOS transistor 103 formed on the substrate 101. In the present embodiment, the substrate 101 is a silicon substrate having a P well 116 and an N well 117 isolated by a shallow-trench-isolation (STI) 112. The NMOS transistor 102 comprises a gate dielectric layer 102a, a gate 102b, spacers 102c and a source/drain 102d, wherein the gate dielectric layer 102a, the gate 102b and the spacers 102c are disposed on the P well 116, and the source/drain 102d is formed in the P well 116. The PMOS transistor 103 comprises a gate dielectric layer 103a, a gate 103b, spacers 103c and a source/drain, wherein the gate dielectric layer 103a, the gate 103b and the spacers 103c are disposed on the N well 117, and the source/drain of the PMOS transistor 103 is formed in the N well 117.

In some embodiments of the present invention, the source/drain of the PMOS transistor 103a may include silicon germanium (SiGe) epitaxial structure 104 in order to enhance its carrier mobility. The formation of the SiGe epitaxial structure 104 comprises following steps: A portion of the substrate 101 of the N well 117 is first removed to form a plurality of trenches (not shown), for example. Subsequently, a selective epitaxy growth (SEG) process is performed to form the SiGe epitaxial structure 104 in the trenches. The SiGe epitaxial structure 104 is not only used as the source/region regions of the PMOS transistor 103, but also increases compressive stress of a channel of the PMOS transistor 103. By adopting the SiGe epitaxial structure 104 as part of the source/drain of the PMOS transistor 103, the mobility of holes of the PMOS transistor 103 is increased, and the operation speed and performance of the PMOS transistor 103 are enhanced.

Next, a buffer layer 105 is formed on the substrate 101, the NMOS transistor 102 and the PMOS transistor 103 (see FIG. 1A). In some embodiments of the present invention, the buffer layer 105 is formed either by a chemical vapor deposition (CVD) process or by a physical vapor deposition (PVD) process. And in the present embodiment, the buffer layer 105 preferably consists of $SiO_2$.

Subsequently, a dielectric layer 106 and a capping layer 107 are formed in sequence on the buffer layer 105 by a CVD or a PVD process; and a UV curing step 113 is then performed on the dielectric layer 106 and the capping layer 107 (see FIG. 1B), so as to make the dielectric layer 106 gradually gaining a tensile stress and subsequently imposing on the substrate 101, the NMOS transistor 102 and the PMOS transistor 103.

In some embodiments of the present invention, the dielectric layer 106 consists of SiN, and the capping layer 107 consists of $SiO_2$. Besides, for the purpose of process design, the dielectric layer 106 and the capping layer 107 can be formed by the same apparatuses (in the same chamber) or otherwise formed by different apparatuses (in different chambers).

Figure 1B:
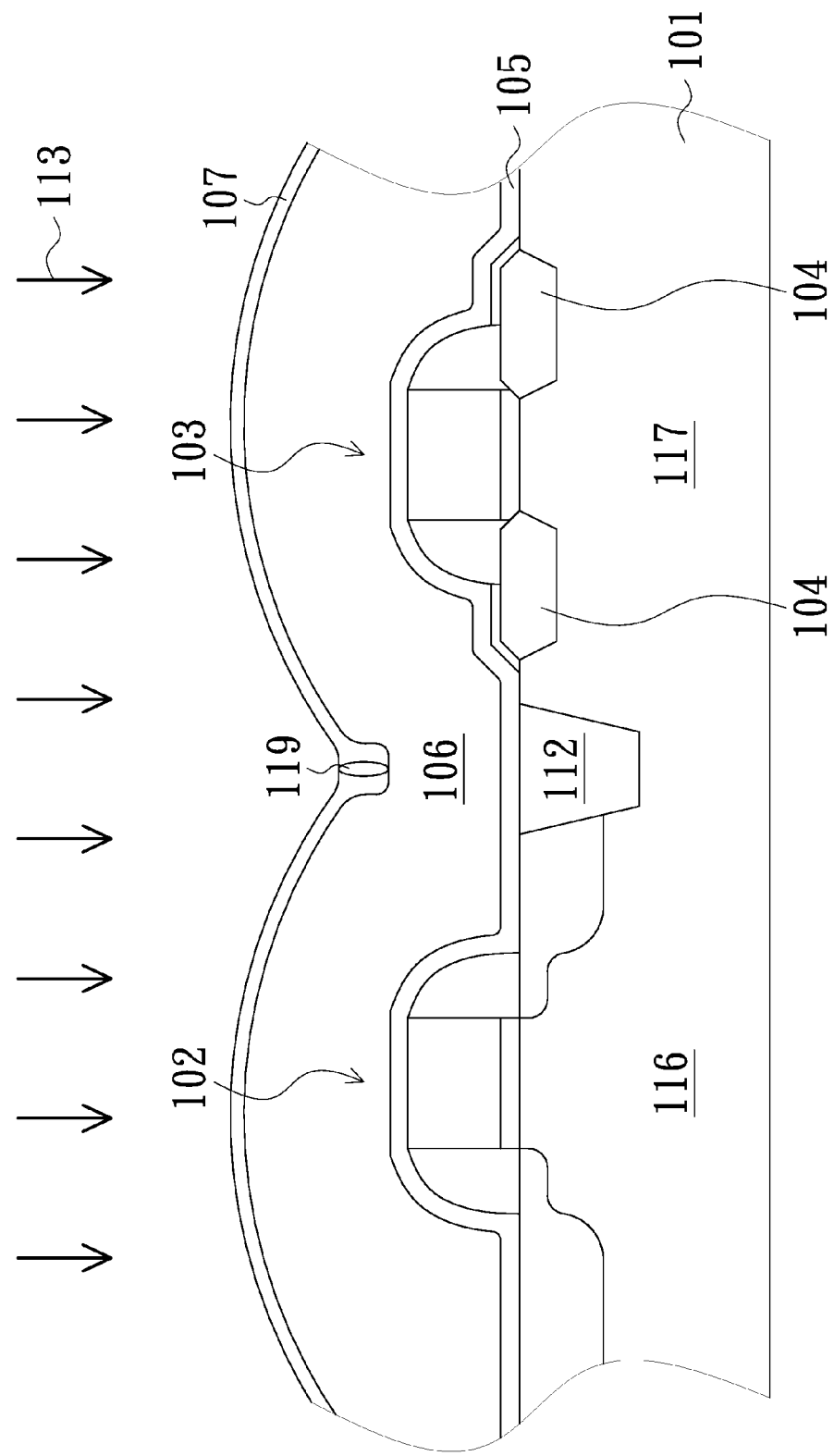

Although the tensile stress-inducing dielectric layer 106 depicted in FIG. 1B is merely illustrated as a single-layer structure, it should be appreciated that in some other embodiment, the tensile stress-inducing dielectric layer 106 may be a multilayer structure formed by a plurality of dielectric deposition steps and a plurality of UV curing steps, wherein each of the dielectric deposition steps is followed by at least one of the UV curing steps. Another UV curing step with a greater curing dosage may be then carried out after the capping layer 107 is formed on the most top dielectric deposition layer, so as to make the tensile stress of the dielectric layer 106 getting enough to a predetermined level. However, during the UV curing step, voids 119 or gaps may occur in the $SiO_2$ capping layer 107 due to the tensile stress imposed the cured SiN dielectric layer 106 and the difference of expansion rate between the cured $SiO_2$ capping layer 107 and the cured SiN dielectric layer 106.

Figure 1C:
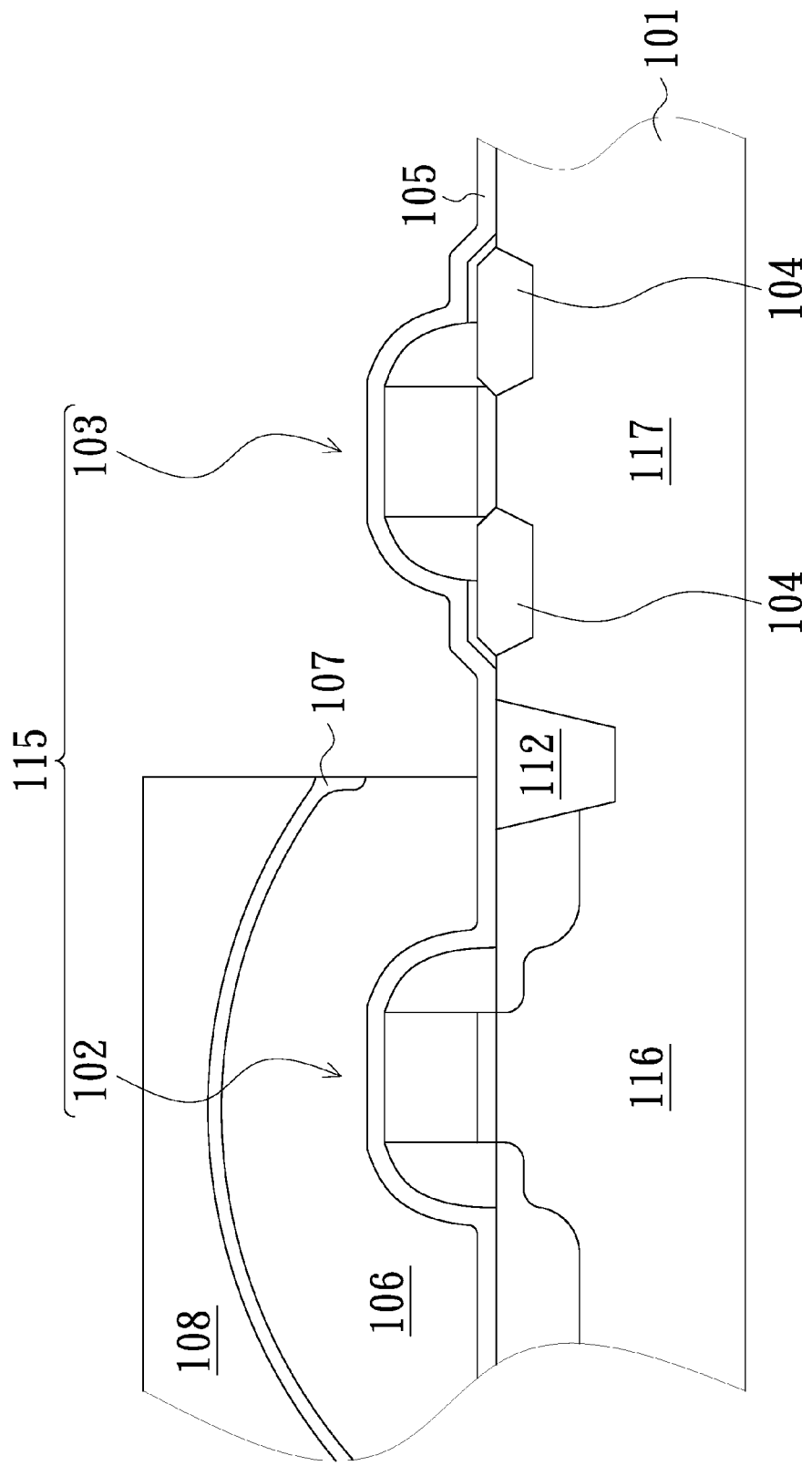
Figure 1D:
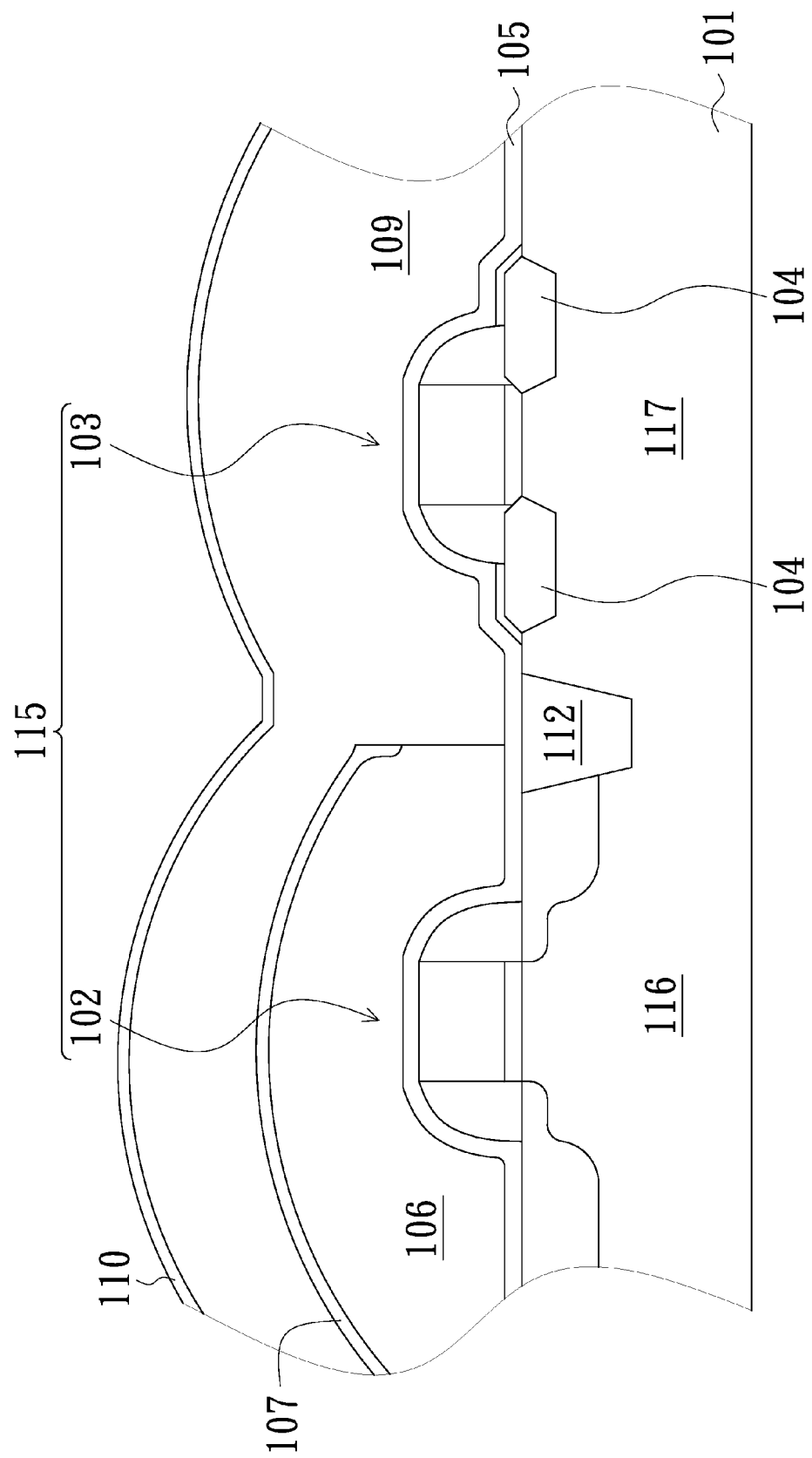

Next, a patterned photo-resist layer 108 is formed on the capping layer 107 and at least one etching step is then performed by using the buffer layer 105 as a stop layer to remove portions of the capping layer 107 and the dielectric layer 106 which are disposed on the PMOS transistor 103 (see FIG. 1C). In some embodiments of the present invention, several etching steps may be arranged to remove the portions of the capping layer 107 and the dielectric layer 106 disposed on the PMOS transistor 103. For example, the capping layer 107 consisting of $SiO_2$ may be moved by a hydrogen fluoride (HF) based wet etch; and the dielectric layer 106 consisting of SiN may be moved by a phosphoric acid ($H_3PO_4$) based wet etch. Otherwise, the $SiO_2$ capping layer 107 and the SiN dielectric layer 106 can be removed simultaneously by a single etching step. In some other embodiments, a reactive ion etching (RIE) process may be performed to remove the $SiO_2$ capping layer 107 and the SiN dielectric layer 106.

For the purpose to further enhance the tensile stress of the dielectric layer 106, an optional anneal step may be performed after the portion of the capping layer 107 disposed on the PMOS transistor 103 is removed. In the present embodiment, a portion of the capping layer 107 disposed on the PMOS transistor 103 is firstly removed by a HF based wet etching. A thermal annealing step is then carried out on the intact dielectric layer 106. Subsequently another wet etching using $H_3PO_4$ as the etchant is performed to remove the portion of the tensile stress-inducing dielectric layer 106 disposed on the PMOS transistor 103. However, in some other embodiments, a RIE process may be firstly performed to remove the portions of the capping layer 107 and the dielectric layer 106 which are disposed on the PMOS transistor 103; and the thermal annealing step is then carried out on the remaining dielectric layer 106, after the patterned photo-resist layer 108 is stripped.

Thereafter, a dielectric layer 109 and a capping layer 110 are formed in sequence on the PMOS transistor 103 and the remaining capping layer 107 (see FIG. 1D) by a CVD or a PVD process. In some embodiments of the present invention, the dielectric layer 109 consists of SiN; the capping layer 110 consists of $SiO_2$; and the dielectric layer 109 may gain a compressive stress by controlling the deposition parameters of SiN.

Similarly, for the purpose of process design, the dielectric layer 109 and the capping layer 110 can be formed by the same apparatuses (in the same chamber) or otherwise formed by different apparatuses (in different chambers). Since the compressive stress-inducing dielectric layer 109 and the process for forming thereof are well known by persons skilled in the art, thus the detail steps, parameters and mechanism thereof will not be redundantly described.

Figure 1E:
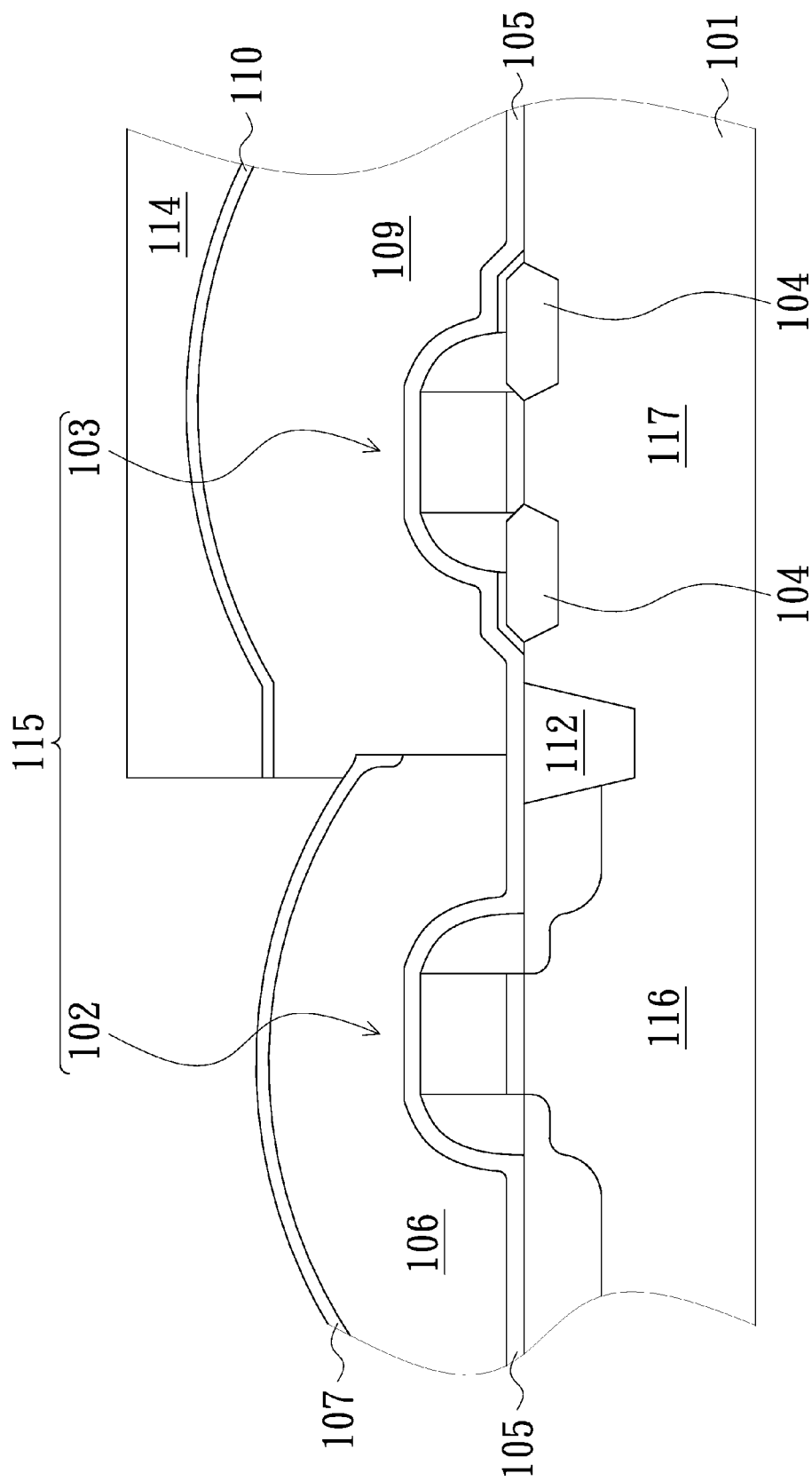

Subsequently, another patterned photo-resist layer 114 is formed on the capping layer 110, and an etching step is then performed by using the capping layer 107 as a stop layer to remove portions of the capping layer 110 and the dielectric layer 109 which are disposed on the NMOS transistor 102, so as to expose the remaining capping layer 107 (see FIG. 1E). In some other embodiments of the present invention, the capping layer 110 may be moved either by a HF based wet etching. The dielectric layer 109 may be moved by a $H_3PO_4$ based wet etch. In some other embodiments, a RIE process may be performed to simultaneously remove the $SiO_2$ capping layer 110 and the SiN dielectric layer 109.

Figure 1F:
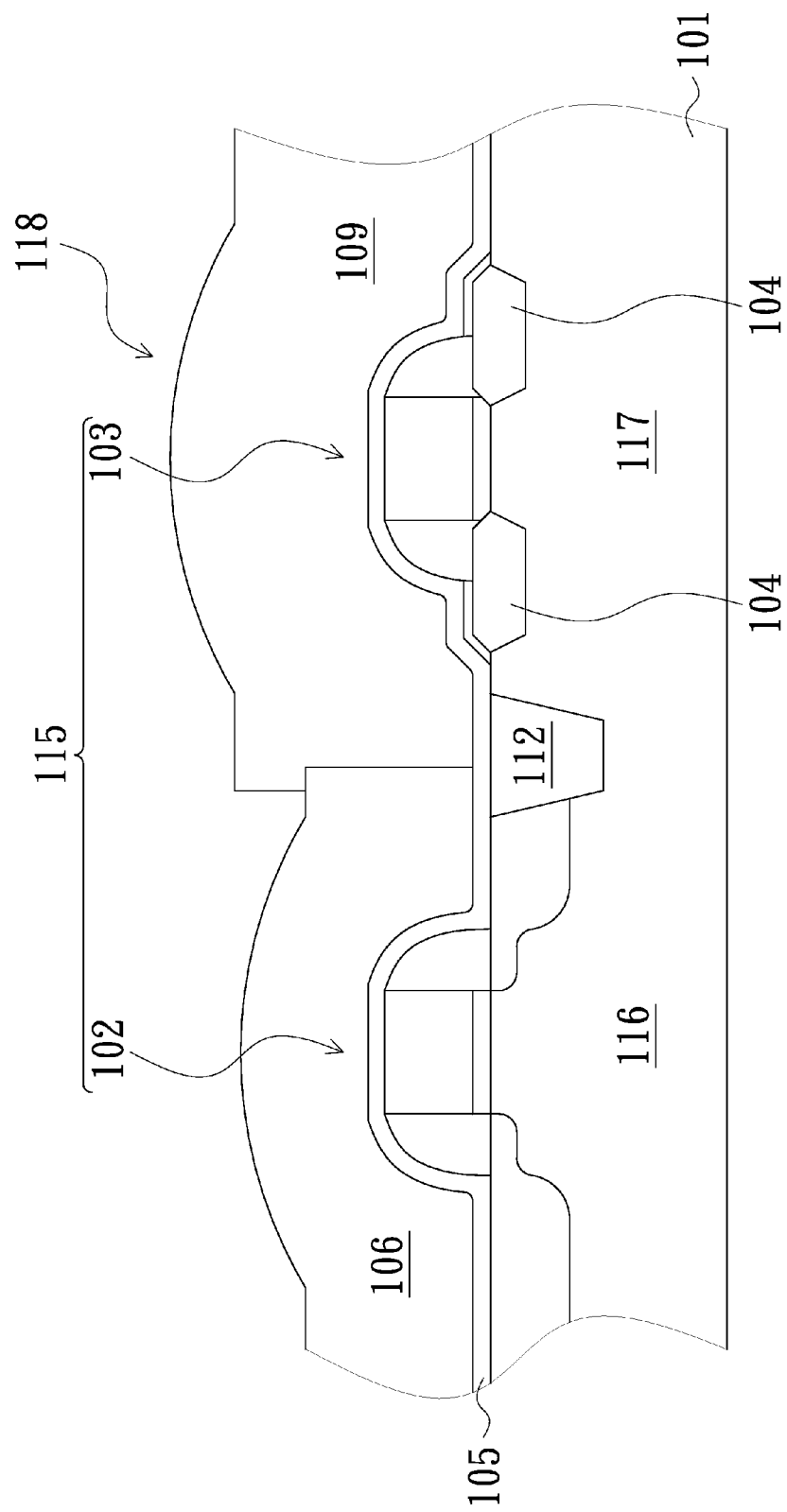
Figure 1G:
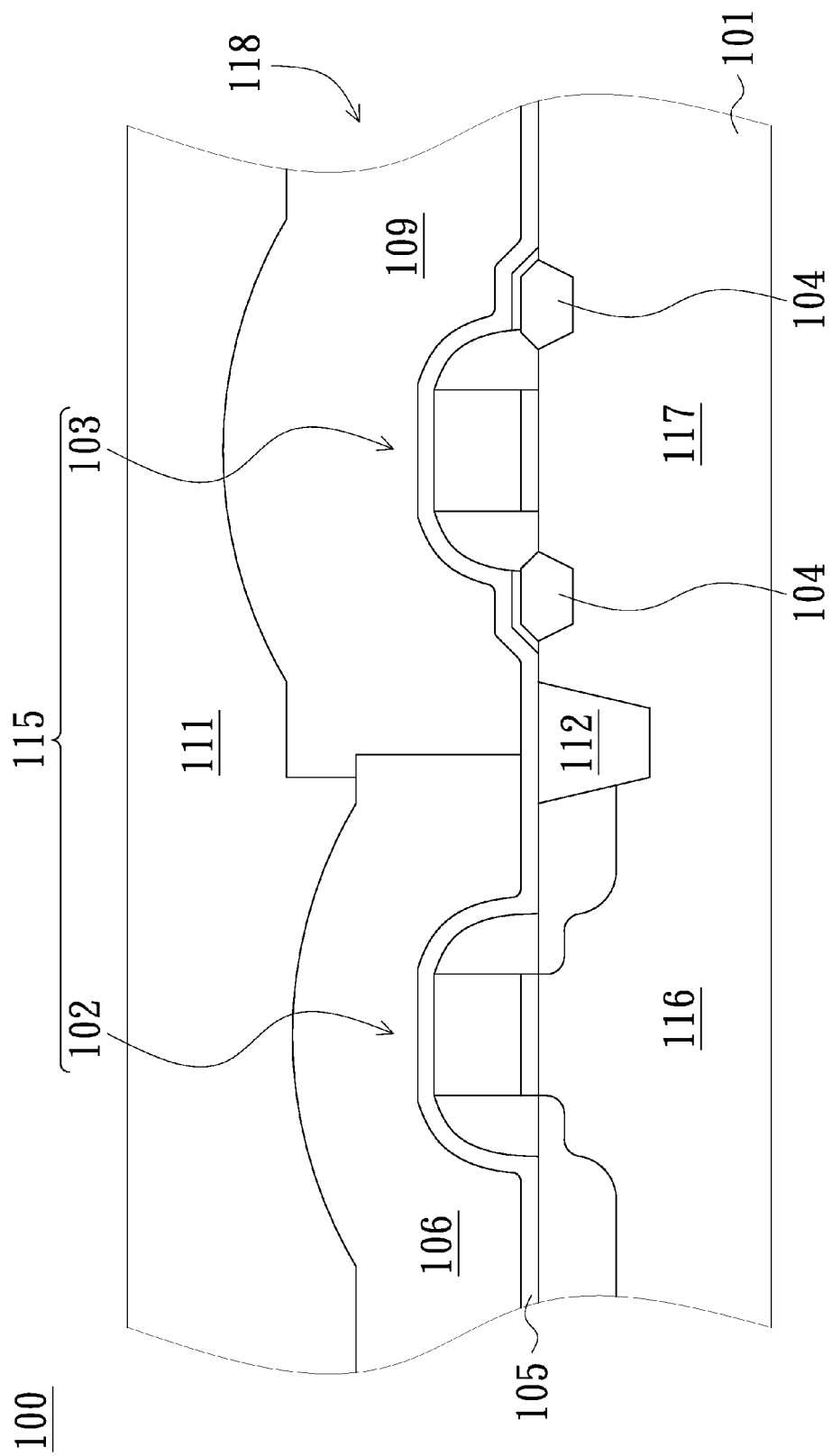

After the patterned photo-resist layer 114 is stripped, a further etching step is performed by using the remaining dielectric layer 106/109 as a stop layer to remove the remaining capping layer 107/110 (see FIG. 1F). In some embodiments of the present invention, the etching step for removing the remaining capping layer 107 may be either a wet etching or a dry etching. In the present embodiment, because the capping layer 110 and the capping layer 107 are both made of $SiO_2$, thus the capping layers 110 and 107 may be removed by the HF based wet etching simultaneously.

Thereafter, a dielectric layer 111 is formed on the dielectric layer 106 and 109, and some other subsequent process for fabricating the semiconductor device 100 may be continually carried out on the dielectric layer 111. For example, in the present embodiment, a metal interconnection structure consisting of an ILD and a plurality of patterned metal layers (not shown) are formed on the dielectric layer 106 and 109, meanwhile the semiconductor device 100 is formed, wherein the dielectric layer 111 consists of dielectric material used to form the ILD. Since the metal interconnection structure and the process for forming thereof are well known by persons skilled in the art, thus the detail steps, parameters and mechanism thereof will not be redundantly described.

It should be appreciated that the process sequence for forming the tensile stress-inducing dielectric layer 106 and the compressive stress-inducing dielectric layer 109 may be exchangeable. For example, in some other embodiments, the tensile stress-inducing dielectric layer 106 and the capping layer 107 can be formed after the formation of the compressive stress-inducing dielectric layer 109 and the capping layer 110, nevertheless, the tensile stress-inducing dielectric layer 106 and the capping layer 107 are formed prior the formation of the compressive stress-inducing dielectric layer 109 and the capping layer 110 in the present embodiment.

In accordance with aforementioned embodiments, a method for fabricating a semiconductor device is provided in order to form a DSL on a CMOS transistor element of the semiconductor device, wherein the method comprises several steps as follows: A first stress-inducing dielectric layer and a first capping layer are formed in sequence on an NMOS transistor; a second stress-inducing dielectric layer and a second capping layer are then formed in sequence on a PMOS transistor; and the first capping layer is subsequently removed.

Since voids and gaps may occur in the aforementioned material layers due to the UV curing steps of the process for forming the tensile stress-inducing dielectric layer, thus by removing the capping layers prior to the subsequent process, such as the process for forming an interconnection, the drawbacks and problems resulted from the voids and gaps can be obviated. Consequently, the problems caused the metal leads extending along the voids and gaps and generated by the interconnection fabrication process, which may cause the semiconductor device shortened can be avoided; and the yield of the semiconductor device can be thereby increased.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a semiconductor device, comprising steps as follows:

providing an first conductive-type metal-oxide-semiconductor (MOS) transistor and a second conductive-type MOS transistor on a substrate;

forming a first stress-inducing dielectric layer and a first capping layer in sequence on the first conductive-type MOS transistor and the second conductive-type MOS transistor;

removing a portion of the first capping layer which is disposed on the second conductive-type transistor;

performing a thermal annealing after the portion of first capping layer disposed on the PMOS transistor is removed;

removing a portion of the first stress-inducing dielectric layer which is disposed on the second conductive-type transistor after the thermal annealing;

forming a second stress-inducing dielectric layer and a second capping layer stacking in sequence on the second conductive-type MOS transistor and a remaining portion of the first capping layer disposed on the first conductive-type transistor;

removing portions of the second stress-inducing dielectric layer and the second capping layer which are disposed on the first conductive-type MOS transistor by using the remaining portion of the first capping layer as an etching stop layer; and removing the first capping layer.

2. The method according to claim 1, wherein the first conductive-type MOS transistor is an N-type MOS (NMOS) transistor and the first stress-inducing dielectric layer is a tensile stress-inducing dielectric layer; the second conductive-type MOS transistor is a P-type MOS (PMOS) transistor and the second stress-inducing dielectric layer is a compressive stress-inducing dielectric layer.

3. The method according to claim 2, further comprising step of performing an UV curing after the tensile stress-inducing dielectric layer and the first capping layer are formed.

4. The method according to claim 2, wherein the formation of the tensile stress-inducing dielectric layer comprises performing a plurality of dielectric deposition steps and each of which is followed by an UV curing step.

5. The method according to claim 1, wherein the first conductive-type MOS transistor is a PMOS transistor and the first stress-inducing dielectric layer is a compressive stress-inducing dielectric layer; the second conductive-type MOS transistor is an NMOS transistor and the second stress-inducing dielectric layer is a tensile stress-inducing dielectric layer.

6. The method according to claim 1, wherein the second capping layer can be removed simultaneously while the first capping layer is removed.

7. The method according to claim 1, wherein the first capping layer and the second capping layer both consist of $SiO_2$.

8. The method according to claim 1, wherein the first stress-inducing dielectric layer and the second stress-inducing dielectric layer both consist of SiN.

9. The method according to claim 1, further comprising steps of forming a buffer layer blanketed over the substrate, the first conductive-type MOS transistor and the second conductive-type MOS transistor prior the formation of the first stress-inducing dielectric layer and the first capping layer.

10. The method according to claim 9, wherein the buffer layer consists of $SiO_2$.

11. The method according to claim 1, further comprising steps of forming a dielectric layer on the first stress-inducing dielectric layer and the second stress-inducing dielectric layer after the first capping layer is removed.

12. The method according to claim 11, wherein the dielectric layer consists of materials used to form an inter layer dielectric (ILD) of a metal interconnection structure.

13. The method according to claim 1, wherein the first stress-inducing dielectric layer and the first capping layer are formed either in the same apparatus or in different apparatus.

14. The method according to claim 1, wherein the second stress-inducing dielectric layer and the second capping layer are formed either in the same apparatus or in different apparatus.

* * * * *